(12) United States Patent
Drogi et al.

(10) Patent No.: US 7,869,542 B2
(45) Date of Patent: Jan. 11, 2011

(54) PHASE ERROR DE-GLITCHING CIRCUIT AND METHOD OF OPERATING

(75) Inventors: Serge F. Drogi, Flagstaff, AZ (US);
Vikas Vinayak, Menlo Park, CA (US);
Mark R. Gehring, Portland, OR (US);
Martin A. Tomasz, San Francisco, CA (US)

(73) Assignee: Quantance, Inc., San Mateo, CA (US)

( * ) Notice: Subject to any disclaimer, the term of this patent is extended or adjusted under 35 U.S.C. 154(b) by 909 days.

(21) Appl. No.: 11/671,423

(22) Filed: Feb. 5, 2007

(65) Prior Publication Data
US 2007/0218848 A1 Sep. 20, 2007

Related U.S. Application Data

(63) Continuation-in-part of application No. 11/429,119, filed on May 4, 2006.

(60) Provisional application No. 60/764,947, filed on Feb. 3, 2006.

(51) Int. Cl.
*H04L 25/00* (2006.01)
(52) U.S. Cl. .................. 375/296; 375/371
(58) Field of Classification Search .......... 375/296, 375/297, 371, 373
See application file for complete search history.

(56) References Cited

U.S. PATENT DOCUMENTS

| | | | |
|---|---|---|---|
| 3,900,823 A * | 8/1975 | Sokal et al. ............ 330/149 |
| 4,262,264 A * | 4/1981 | Vandegraaf ............ 331/4 |
| 4,420,723 A * | 12/1983 | de Jager ............ 330/10 |
| 4,591,800 A | 5/1986 | Opas |
| 4,754,260 A | 6/1988 | Nelson et al. |
| 5,023,937 A | 6/1991 | Opas |
| 5,087,829 A | 2/1992 | Ishibashi et al. |
| 5,128,629 A | 7/1992 | Trinh |
| 5,142,240 A | 8/1992 | Isota et al. |
| 5,410,276 A * | 4/1995 | Hwang et al. ............ 330/297 |
| 5,590,408 A * | 12/1996 | Weiland et al. ............ 455/69 |
| 5,606,285 A | 2/1997 | Wang et al. |
| 5,675,288 A | 10/1997 | Peyrotte et al. |
| 5,732,334 A | 3/1998 | Miyake |
| 5,815,531 A | 9/1998 | Dent |
| 5,822,442 A | 10/1998 | Agnew et al. |

(Continued)

FOREIGN PATENT DOCUMENTS

EP 0473299 A2 3/1992

(Continued)

OTHER PUBLICATIONS

United States Office Action, U.S. Appl. No. 11/670,402, Apr. 2, 2010, 25 pages.

(Continued)

*Primary Examiner*—David B Lugo
(74) *Attorney, Agent, or Firm*—Fenwick & West LLP

(57) ABSTRACT

A system including a phase comparator to compare a first signal and a second signal to generate a phase error signal, and a controller to generate an adjusted phase error signal from the phase error signal in response to an amplitude of at least one of the first signal and the second signal.

4 Claims, 7 Drawing Sheets

U.S. PATENT DOCUMENTS

| | | | |
|---|---|---|---|
| 5,880,633 A | 3/1999 | Leizerovich et al. | |
| 5,936,464 A * | 8/1999 | Grondahl | 330/10 |
| 5,973,556 A | 10/1999 | Su | |
| 6,002,300 A | 12/1999 | Herbster et al. | |
| 6,031,421 A | 2/2000 | McEwan | |
| 6,043,707 A | 3/2000 | Budnik | |
| 6,133,792 A | 10/2000 | Hansson | |
| 6,141,541 A | 10/2000 | Midya et al. | |
| 6,166,596 A | 12/2000 | Higashiyama et al. | |
| 6,166,598 A | 12/2000 | Schlueter | |
| 6,175,273 B1 | 1/2001 | Sigmon et al. | |
| 6,198,347 B1 * | 3/2001 | Sander et al. | 330/251 |
| 6,208,199 B1 | 3/2001 | Andersson | |
| 6,275,685 B1 | 8/2001 | Wessel et al. | |
| RE37,407 E | 10/2001 | Eisenberg et al. | |
| 6,300,826 B1 | 10/2001 | Mathe et al. | |
| 6,353,359 B1 | 3/2002 | Leizerovich | |
| 6,377,784 B2 | 4/2002 | McCune | |
| 6,404,823 B1 | 6/2002 | Grange et al. | |
| 6,437,641 B1 | 8/2002 | Bar-David | |
| 6,438,360 B1 | 8/2002 | Alberth, Jr. et al. | |
| 6,445,249 B1 | 9/2002 | Khan et al. | |
| 6,472,934 B1 | 10/2002 | Pehike | |
| 6,528,975 B2 | 3/2003 | Sander | |
| 6,539,072 B1 | 3/2003 | Donnelly et al. | |
| 6,583,664 B2 | 6/2003 | Mathe et al. | |
| 6,633,199 B2 * | 10/2003 | Nielsen et al. | 330/129 |
| 6,646,501 B1 | 11/2003 | Wessel | |
| 6,661,210 B2 | 12/2003 | Kimball et al. | |
| 6,734,724 B1 | 5/2004 | Schell et al. | |
| 6,741,127 B2 | 5/2004 | Sasho et al. | |
| 6,781,452 B2 | 8/2004 | Cioffi et al. | |
| 6,825,726 B2 * | 11/2004 | French et al. | 330/297 |
| 6,917,244 B2 | 7/2005 | Rosneil et al. | |
| 6,924,695 B2 | 8/2005 | Cioffi et al. | |
| 6,924,700 B2 | 8/2005 | Taura et al. | |
| 6,924,711 B2 | 8/2005 | Liu | |
| 6,928,272 B2 | 8/2005 | Doi | |
| 6,968,163 B2 | 11/2005 | Kuechler et al. | |
| 7,058,373 B2 * | 6/2006 | Grigore | 455/127.1 |
| 7,068,743 B1 | 6/2006 | Suzuki | |
| 7,109,897 B1 | 9/2006 | Levesque | |
| 7,197,286 B2 | 3/2007 | Ode et al. | |
| 7,250,815 B2 | 7/2007 | Taylor et al. | |
| 7,359,685 B2 | 4/2008 | Jafari et al. | |
| 7,440,731 B2 | 10/2008 | Staudinger et al. | |
| 7,761,065 B2 | 7/2010 | Drogi et al. | |
| 2002/0053897 A1 | 5/2002 | Kajiwara et al. | |
| 2002/0137481 A1 | 9/2002 | Chen et al. | |
| 2002/0168949 A1 | 11/2002 | Johannisson et al. | |
| 2002/0175764 A1 | 11/2002 | Matsuura et al. | |
| 2003/0017840 A1 | 1/2003 | Katagishi et al. | |
| 2003/0155978 A1 | 8/2003 | Pehlke | |
| 2004/0071225 A1 | 4/2004 | Suzuki et al. | |
| 2004/0162039 A1 | 8/2004 | Marque-Pucheu | |
| 2004/0189378 A1 | 9/2004 | Suzuki et al. | |
| 2004/0198257 A1 | 10/2004 | Takano et al. | |
| 2004/0263254 A1 | 12/2004 | Tahara et al. | |
| 2005/0046474 A1 | 3/2005 | Matsumoto et al. | |
| 2005/0059362 A1 | 3/2005 | Kalajo et al. | |
| 2005/0064830 A1 | 3/2005 | Grigore | |
| 2005/0122163 A1 | 6/2005 | Chu | |
| 2005/0156662 A1 * | 7/2005 | Raghupathy et al. | 330/10 |
| 2005/0242880 A1 | 11/2005 | Dornokos et al. | |
| 2006/0001483 A1 | 1/2006 | Cioffi et al. | |
| 2006/0040625 A1 | 2/2006 | Saito et al. | |
| 2006/0232332 A1 | 10/2006 | Braithwaite | |
| 2007/0096806 A1 | 5/2007 | Sorrells et al. | |
| 2007/0184791 A1 | 8/2007 | Vinayak et al. | |
| 2007/0184792 A1 | 8/2007 | Drogi et al. | |
| 2007/0184793 A1 | 8/2007 | Drogi et al. | |
| 2007/0184794 A1 | 8/2007 | Drogi et al. | |
| 2007/0184795 A1 | 8/2007 | Drogi et al. | |
| 2007/0184796 A1 | 8/2007 | Drogi et al. | |
| 2007/0247253 A1 | 10/2007 | Carey et al. | |

FOREIGN PATENT DOCUMENTS

| | | |
|---|---|---|
| EP | 1225690 A2 | 7/2002 |
| EP | 0812064 B1 | 9/2003 |
| JP | 04-192907 A | 7/1992 |
| JP | 06-164249 A | 6/1994 |
| JP | 8-204774 A | 8/1996 |
| JP | 2000-507751 A | 6/2000 |
| JP | 3207153 B2 | 7/2001 |
| JP | 2001-519612 A | 10/2001 |
| JP | 2005-117315 A | 4/2005 |
| WO | WO 95/34128 A1 | 12/1995 |
| WO | WO 97/28598 A1 | 8/1997 |
| WO | WO 99/18663 A1 | 4/1999 |
| WO | WO 99/59243 A1 | 11/1999 |
| WO | WO 00/16473 A1 | 3/2000 |
| WO | WO 01/65685 A1 | 9/2001 |
| WO | WO 2005/036739 A1 | 4/2005 |
| WO | WO 2005/041438 A1 | 5/2005 |
| WO | WO 2005/101678 A2 | 10/2005 |

OTHER PUBLICATIONS

United States Office Action, U.S. Appl. No. 11/621,522, Apr. 21, 2010, 16 pages.
United States Office Action, U.S. Appl. No. 11/670,931, Apr. 28, 2010, 20 pages.
U.S. Office Action, U.S. Patent Appl. No. 11/623,030, Sep. 1, 2009, 7 pages.
U.S. Office Action, U.S. Patent Appl. No. 11/669,648, Aug. 6, 2009, 11 pages.
U.S. Office Action, U.S. Appl. No. 11/621,522, Oct. 5, 2009, 5 pages.
"The Changing Face of Amplifier Design," Nujira, [online] [Retrieved on Apr. 5, 2006] Retrieved from the Internet<URL:http://www.nujira.com/technology/>.
Fergus, T.J., "EDGE Modulation—How Linearization Improves Amplifier Performance," RFDesign, Oct. 2002, 7 pages.
"LF-2.7 GHz RF/IF Gain and Phase Detector, AD8302," Analog Devices, Inc., 2002, [online] [Retrieved on Apr. 5, 2006] Retrieved from the Internet<URL:http://www.analog.com/UploadedFiles/Data_Sheets/797075782AD8302_a.pdf#search='AD8302'>.
McCune, Jr., E.W., "Direct Polar Modulation has the Right Stuff," CommsDesign, Nov. 7, 2005, [online] [Retrieved on Apr. 5, 2006] Retrieved from the Internet<URL:http://www.commsdesign.com/showArticle.jhtm?articleID=173500205>.
Morgan, P., "Highly Integrated Transceiver Enables High-Volume Production of GSM/EDGE Handsets," Silicon Laboratories, Inc., 2005, 6 pages, [online] [Retrieved on Apr. 5, 2006] Retrieved from the Internet<URL:http://www.silabs.com/public/documents/marcom_doc/mcoll/Wireless/Aero_RF_Transceivers/en/Aerolle_Overview.pdf>.
PCT International Search Report and Written Opinion, PCT/US07/02389, Oct. 19, 2007, 10 pages.
PCT International Search Report and Written Opinion, PCT/US07/61499, Nov. 6, 2007, 11 pages.
PCT International Search Report and Written Opinion, PCT/US07/61578, Oct. 11, 2007, 7 pages.
PCT International Search Report and Written Opinion, PCT/US07/02676, Nov. 6, 2007, 9 pages.
Raab, F. et al., "RF and Microwave Power Amplifier and Transmitter Technologies—Part 3," High Frequency Electronics, Sep. 2003, pp. 34-48.
Raab, F. et al., "RF and Microwave Power Amplifier and Transmitter Technologies—Part 4," High Frequency Electronics, Nov. 2003, pp. 38-49.
"SEQ5400—The World's First Single-Chip WEDGE Transceiver," Sequoia Communications, [online] [Retrieved on Apr. 5, 2006] Retrieved from the Internet<URL:http:www.sequoia-communications.com/SEQ5400Data_Sheet.pdf>.

Sowlati, T. et al., "Polar Loop Transmitter," Skyworks™, [online] [Retrieved on Apr. 5, 2006] Retrieved from the Internet<URL:http://paworkshop.ucsd.edu/papers2004/S1_2Polar%20Loop%20Transmitter.ppt>.

Wilkins, B. et al., "Large Signal Polar Modulation Reduces Heat Dissipation and Increases Battery Life in EDGE Handsets" Feb. 2005, Microwave Product Digest, [online] [Retrieved on Apr. 5, 2006] Retrieved from the Internet<URL:http:www.mpdigest.com/Articles/2005/feb2005/rfmd/Default.htm>.

United States Office Action, U.S. Appl. No. 11/429,119, Oct. 29, 2009, 25 pages.

United States Office Action, U.S. Appl. No. 12/761,258, Aug. 5, 2010, 6 pages.

United States Office Action, U.S. Appl. No. 11/669,648, Aug. 5, 2010, 7 pages.

United States Office Action, U.S. Appl. No. 11/429,119, Sep. 17, 2010, 27 pages.

Japanese Office Action, Japanese Application No. 2008-553333, Oct. 1, 2010, 5 pages.

Japanese Office Action, Japanese Application No. 2008-553289, Sep. 30, 2010, 5 pages.

Japanese Office Action, Japanese Application No. 2008-553347, Oct. 1, 2010, 6 pages.

United States Office Action, U.S. Appl. No. 12/815,209, Oct. 19, 2010, 6 pages.

* cited by examiner

PHASE ERROR DE-GLITCHING CIRCUIT AND METHOD OF OPERATING

CROSS-REFERENCE TO RELATED APPLICATION

This application claims priority under 35 U.S.C. 119(e) from co-pending U.S. Provisional Patent Application No. 60/764,947, entitled "RF Power Amplifier with Efficiency Improvement for High Peak to Average Modulation Types," filed on Feb. 3, 2006; and this application is a continuation-in-part application of, and claims the benefit under 35 U.S.C. §120 from co-pending U.S. Non-provisional patent application Ser. No. 11/429,119 entitled "Power Amplifier Control Circuit," filed on May 4, 2006, the subject matter of which is incorporated by reference herein in its entirety.

BACKGROUND

This disclosure relates to phase error signals in electronic circuits and, in particular, to reducing distortion from phase error signals in electronic circuits.

In communications signals, information is routinely embedded into the signal's phase. As a result, many systems require that circuitry passes a signal's phase accurately. However, such circuitry may not accurately pass the phase of the signal, introducing phase distortion. For example, amplitude-to-phase re-modulation can occur in an RF amplifier while passing a large amplitude modulated RF signal. As a result, the phase of the modulated RF signal and the corresponding information embedded in the phase may be distorted.

Therefore, there is a need for a circuit that can correct the phase distortion.

DETAILED DESCRIPTION

Figure 1:
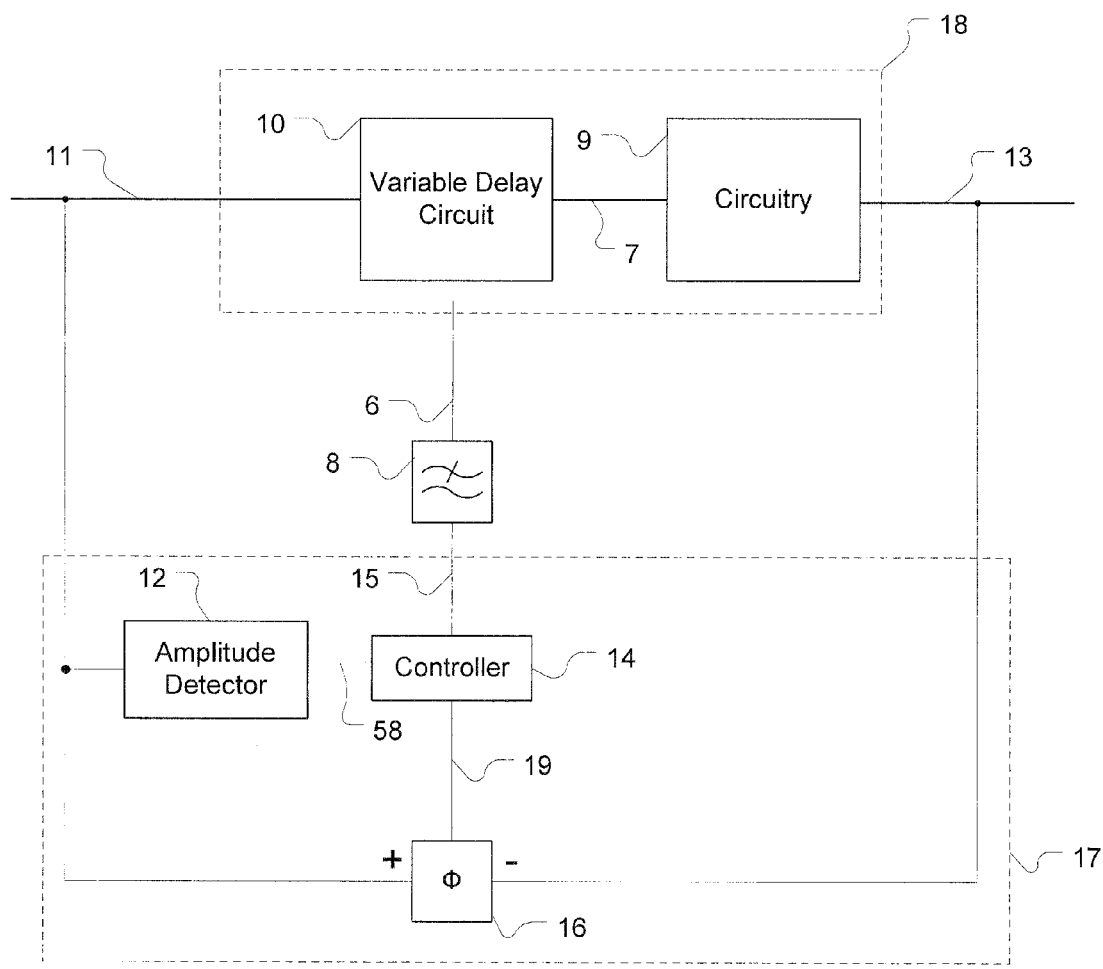
FIG. 1 is a block diagram of a system according to an embodiment.

FIG. 1 is a block diagram of an example of a system according to an embodiment. Circuitry 9 shown in the figure is circuitry that may not accurately pass the phase of the signal from the input 7 of circuitry 9 to output 13, introducing phase distortion. In this example, to correct for this phase distortion, a phase correction loop is closed around the circuitry 9. A variable delay circuit 10 is added in the path of circuitry 9. The variable delay circuit 10 is configured to controllably delay input signal 11 into a delayed input signal 7. Phase comparator 16 can compare the phases of the input 11 and output 13 of combined circuit with variable delay 18, and generates a phase error signal 19. The phase error signal is used to adjust variable delay circuit 10 to hold constant the phase difference between input 11 and output 13. The phase correction loop can include a lowpass filter 8 to ensure stability of the loop. The lowpass filter 8 can filter the phase error signal 19 before it is used to adjust the variable delay circuit 10 in the path of the circuitry 9. In this case, the variable delay circuit 10 receives an adjusted, filtered phase error signal 6.

Some modulated input signals exhibit a large phase shift, e.g., a 180 degree phase shift. Using a phase correction loop such as in the example described above, the 180 degree phase shift of the input signal propagates through the circuit with variable delay 18. After a delay time has passed, the 180 degree phase shift appears on the output signal. Phase comparator 16 indicates the 180 degree phase shift as the phase error signal 19 for a period equivalent to the delay time. This occurs because the 180 degree phase shift has not propagated to the output signal 13 until after the delay to cancel the 180 degree phase shift in the input signal 11.

Since the phase error signal 19 may be used to adjust the variable delay circuit 10 to hold constant the phase difference between input 11 and output 13, delay circuit 10 attempts to adjust the phase of the input 11 by the 180 degree phase shift during the delay time. Such a large change in the control of the delay circuit 10 may introduce distortion into the output signal.

Additionally, the design of the phase comparator 16 may be optimized to handle a modest degree of phase difference at its inputs 11 and 13. A change in the phase difference of 180 degrees may cause the phase comparator 16 to produce an incorrect output. Accordingly, the action of the phase loop during rapid phase shifts during the delay time (e.g. 180 degrees phase shifts in the modulation) can be reduced in an embodiment, reducing distortion in the output signal.

In an embodiment, FIG. 1 additionally introduces controller 14 and amplitude detector 12 to the phase loop described. Amplitude detector 12 generates an input amplitude signal 58 indicating the amplitude of the input signal 11. The amplitude detector 12 may be implemented in a variety of ways. For example, the amplitude detector 12 may be a received signal strength indicator (RSSI). Alternatively, the amplitude detector 12 may be a diode detector. Any circuit that detects the amplitude of a signal may be used.

The controller 14 generates an adjusted phase error signal 15 from the phase error signal 19 in response to the input amplitude signal 58. Thus, the controller 14 adjusts the phase error signal 19 in response to the amplitude of the input signal 11 to generate the adjusted phase error signal 15. The filter 8 filters the adjusted phase error signal 15 into the filtered adjusted phase error signal 6. The controllable delay in the variable delay circuit 10 is responsive to filtered adjusted phase error signal 6.

Figure 2:
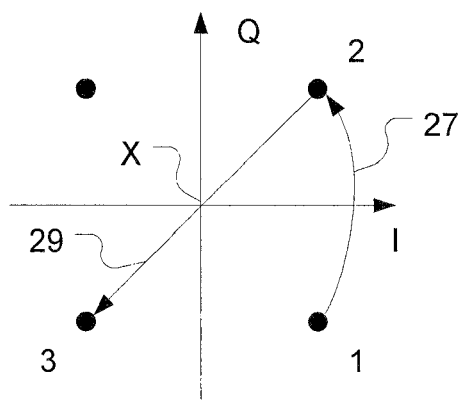
FIG. 2 is a series of charts illustrating an example of signal modulation.
Figure 2:
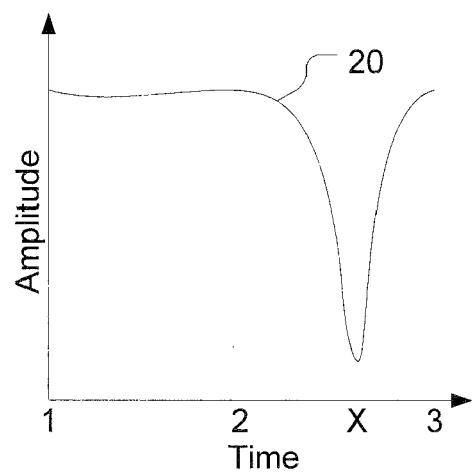
Figure 2:
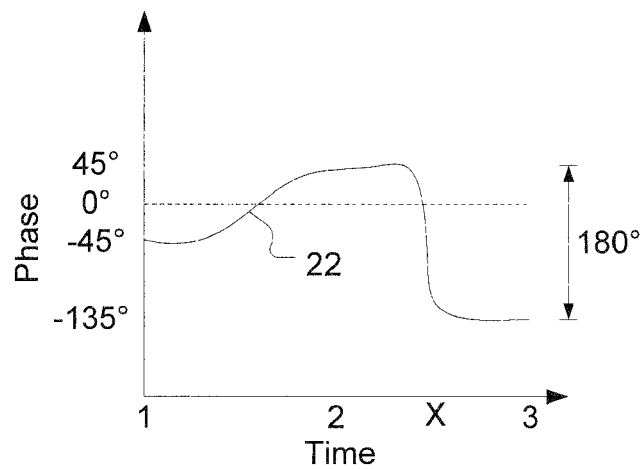

FIG. 2 is a series of charts illustrating an example of signal modulation. In one embodiment, the input signal 11 may be such a modulated signal. For example, the input signal 11 may be modulated with a quadrature phase shift keying (QPSK) modulation. Chart 21 is a constellation diagram illustrating QPSK modulation. Transition 27 shows the trajectory from point 1 to point 2. Transition 29 shows the trajectory from point 2 to point 3. Point X marks a location on the transition 29 where the transition 29 passes through or near the origin. As indicated by the arrows on trajectories 27 and 29, in this example, as time passes the trajectory goes from point 1 to point 2, and from point 2 through point X to point 3.

Chart 23 shows the amplitude 20 of the modulated signal versus time. Points 1, 2, X, and 3 are indicated on the time axis to show when the trajectory passes through the points. When the trajectory 29 passes through or near point X, the amplitude 20 passes through a minimum.

Similarly, chart 25 shows the phase 22 of the modulated signal versus time. Again, points 1, 2, X, and 3 indicate when the trajectory passes through the points. When the trajectory 29 passes through or near point X, the phase exhibits a 180 degree phase shift.

Although throughout this description, a 180 degree phase shift is used as an example of a phase shift, embodiments are not limited to operating only in response to 180 degree phase shifts. Embodiments may operate in response to any phase shift of any magnitude as desired.

Figure 3:
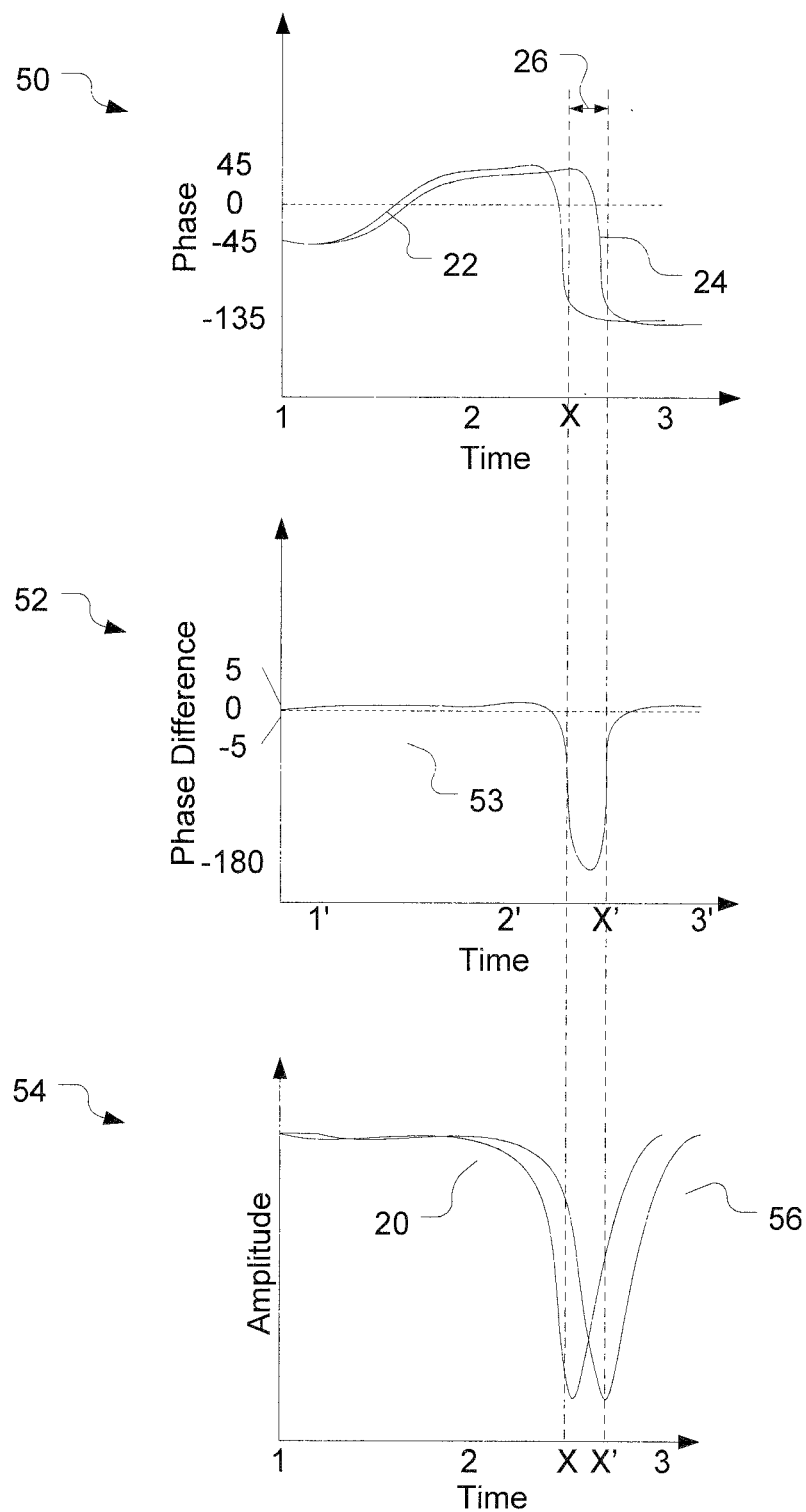
FIG. 3 is a series of charts illustrating a phase discontinuity due to a delay and a relationship of the phase discontinuity to amplitude.

FIG. 3 is a series of charts illustrating a phase discontinuity due to a delay. Chart 50 shows the phase 22 and the delayed phase 24. The delayed phase 24 is delayed by a time 26. In this embodiment, the delay is introduced by the sum of delays of the circuitry 9 and the variable delay circuit 10. Phase 22 corresponds to the phase of the input signal 11. Similarly, delayed phase 24 corresponds to the phase of the output signal 13.

Chart 52 shows the phase difference 53 between the phase 22 and the delayed phase 24. Points 1', 2', X', and 3' corresponding to the points 1, 2, X, and 3 as delayed by time 26. The phase difference 54 is an example of the phase error signal 19 from the phase comparator 16.

Between point 2 and point X the phase 22 is relatively stable at about 45 degrees. After point X, the phase 22 is relatively stable at about −135 degrees. Passing through point X, the phase 22 transitions from about 45 degrees to about −135 degrees, a 180 degree phase shift. When the 180 degree phase shift in the input signal 11 occurs at the phase comparator 16, that 180 degree phase shift has not passed through the circuit with variable delay 18. The 180 degree phase shift will not appear on the output signal 13 until after the time 26 passes. Thus, the phase difference 53 and the corresponding phase error signal 19 from the phase comparator 16 exhibits a 180 phase difference over the time 26.

Chart 54 is similar to chart 23, showing the amplitude 20 of the input signal 11. In addition, chart 54 shows the delayed amplitude 56. The phase changes occurring around point X and point X' correspond to about the minimum amplitudes of amplitude 20 and delayed amplitude 56, respectively. Thus, the 180 degree phase error on phase error signal 19 is correlated with a low amplitude on both the input signal 11 and output signal 13.

Referring back to FIG. 1, the amplitude detector 12 detects the amplitude of the input signal 11. In one example, the controller 14 is a multiplier. Using this example of the controller 14, the input amplitude signal 58 is multiplied with the phase error signal 19 in the controller 14. When the amplitude of the input signal 11 is relatively high, the phase error signal 19 is multiplied with a signal that is relatively high. Similarly, when the amplitude of the input signal 11 is relatively low, the phase error signal 19 is multiplied by a signal that is relatively low. Since the 180 degree phase error on the phase error signal 19 corresponds to a low input amplitude signal 58, the 180 degree phase error on the phase error signal 19 will be multiplied with a relatively low value. Thus, in the adjusted phase error signal 15 the 180 degree phase error will be reduced relative to the remainder of the adjusted phase error signal 15. Consequently, the distortion on the output signal 13 from such a phase error is reduced.

Furthermore, a particular phase comparator 16 may be optimized to handle a change in the phase difference at its inputs less than +/−180 degrees. As a result, a change in the difference of 180 degrees may cause the phase comparator 16 to produce an incorrect output. By reducing the effect of larger phase shifts, distortion introduced by an incorrect phase error output from such a phase comparator 16 will be reduced.

Referring again to FIG. 3, the time 26, which is approximately the time in which the adjusted phase error signal 15 is reduced as described above, is less than the time spent in states 1, 2, or 3. In the example illustrated in FIG. 3, the time 26 is relatively small as compared with the time spent in states 1, 2, or 3. During such a time, the operation of the control loop approaches an open-loop condition since the adjusted phase error signal 15 is reduced and an amount of residual distortion may be introduced. However, the input and output signal amplitudes 20 and 56 are relatively low. As a result, residual distortion in the output signal 13 due to the reduction of the adjusted phase error signal 15, and the resulting lack of loop phase correction to the phase has a reduced effect.

Referring again to FIG. 1, one specific example of a multiplier is a Gilbert cell multiplier. In controller 14, a first input receives the input amplitude signal 58 and a second input receives the phase error signal 19. The adjusted phase error signal 15 is generated on the output of the Gilbert cell multiplier.

In another embodiment, the controller 14 may be a variable gain amplifier. In this embodiment, the input amplitude signal 58 is used as the control for the gain of the variable gain amplifier. When the 180 degree phase shift occurs on the phase error signal 19, the gain of the variable gain amplifier may be reduced to reduce the effect of the 180 degree phase shift.

Although the variable delay circuit 10 and the circuitry 9 have been described as distinct, the variable delay circuit 10 and the circuitry 9 may be part of a circuit with variable delay 18. Within the circuit with variable delay 18, the variable delay circuit 10 and the circuitry 9 may be coupled in a variety of ways. As described above, the variable delay circuit 10 can be coupled to an input of the circuitry 9. For example, the circuitry 9 can be an RF amplifier with the variable delay circuit 10 coupled to its input.

In another example, the variable delay circuit 10 may be coupled to an output of the circuitry 9. Thus, the circuitry 9 affects the input signal 11 and the variable delay circuit 10 delays the signal output from the circuitry 9 to generate the output signal 13. As a result, the circuit with variable delay 18 receives the input signal 11 and generates the output signal 13.

Alternatively, the variable delay circuit 10 may be part of the circuitry 9. For example, a variable capacitance within an amplifier may introduce a variable delay through the amplifier. Thus, in this example, the circuit with variable delay 18 is the amplifier itself with a variable delay input.

The phase comparator 16 is configured to compare the input signal 11 to the output signal 13 to generate a phase error signal 19. The phase error signal 19 indicates a difference in phase between the input signal 11 and the output signal 13. A variety of designs may be used for a phase comparator 16. For example, the phase comparator 16 may be a Gilbert cell multiplier with limiters on the inputs. The phase comparator 16 may include circuitry in its design which accommodates a range of differences in phase between its inputs 11 and 13. In one example, the phase comparator 16 can output a nominal phase error signal 19 if the difference in phase between its inputs is 45 degrees. In another example, the phase comparator 16 can output a nominal phase error signal 19 if the difference in phase between its inputs is 0 degrees.

Although a plus sign and a minus sign have been illustrated in FIG. 1 at the inputs to the phase comparator 16, one skilled in the art will understand the inputs and polarities may be changed to appropriately generate the feedback. For example, for a variable delay circuit 10 with a first delay versus input response, the polarity of the phase comparator 16 may be as illustrated. However in another example, the variable delay circuit 10 may have a second delay versus input response that is inverted relative to the first delay versus input response. Accordingly, the polarities of the phase comparator 16 may be reversed.

Although the filter 8 has been illustrated as a low pass filter in FIG. 1, the filter may have any shape as desired to achieve a particular closed-loop response of the system. Furthermore, although the filter 8 has been illustrated as distinct, the filter 8 may be part of other components of the system. For example, the frequency response of the input of the variable delay circuit 10 may introduce a sufficient amount of filtering. As a result, the filter 8 may, but need not be included according to the desired response and the components used in the system.

As described above, the system creates a phase correction loop around the circuitry 9. As a result a particular phase relationship can be maintained between its input and output.

Figure 4:
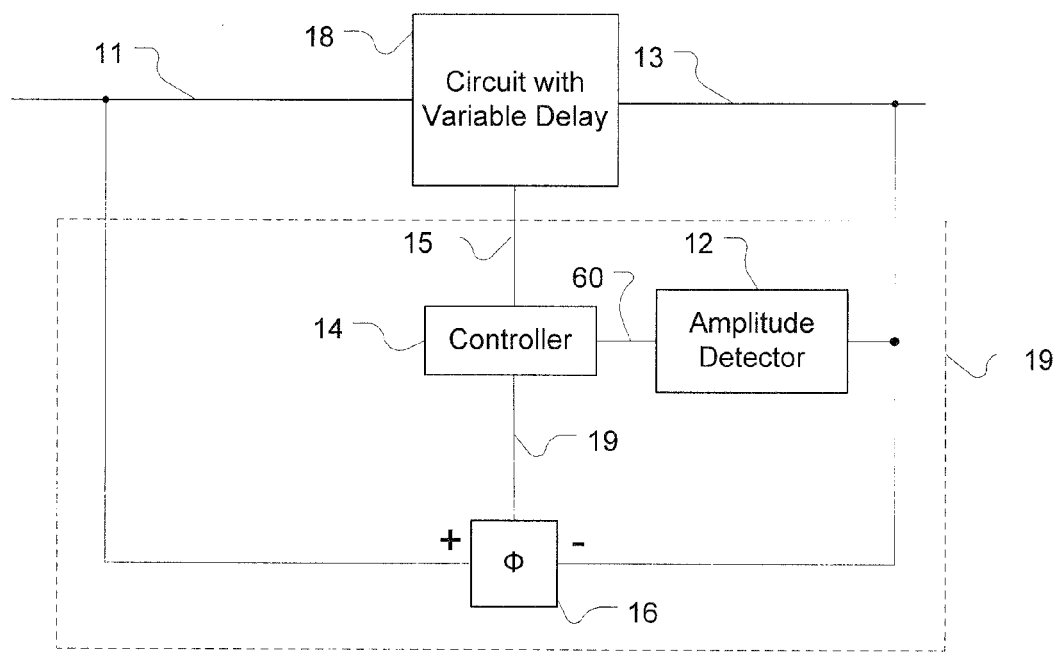
FIG. 4 is a block diagram of a system according to another embodiment.

FIG. 4 is a block diagram of a system according to another embodiment. In this embodiment, the amplitude detector 12 receives the output signal 13. From the output signal 13, the amplitude detector 12 generates the output amplitude signal 60. As described above, a low amplitude of the output signal 13 is correlated with the 180 degree phase error between on the phase error signal 19. If the output amplitude signal 60 is multiplied with the phase error signal 19, in the adjusted phase error signal 15, the 180 degree phase error is reduced relative to when the output amplitude signal 60 is low.

Figure 5:
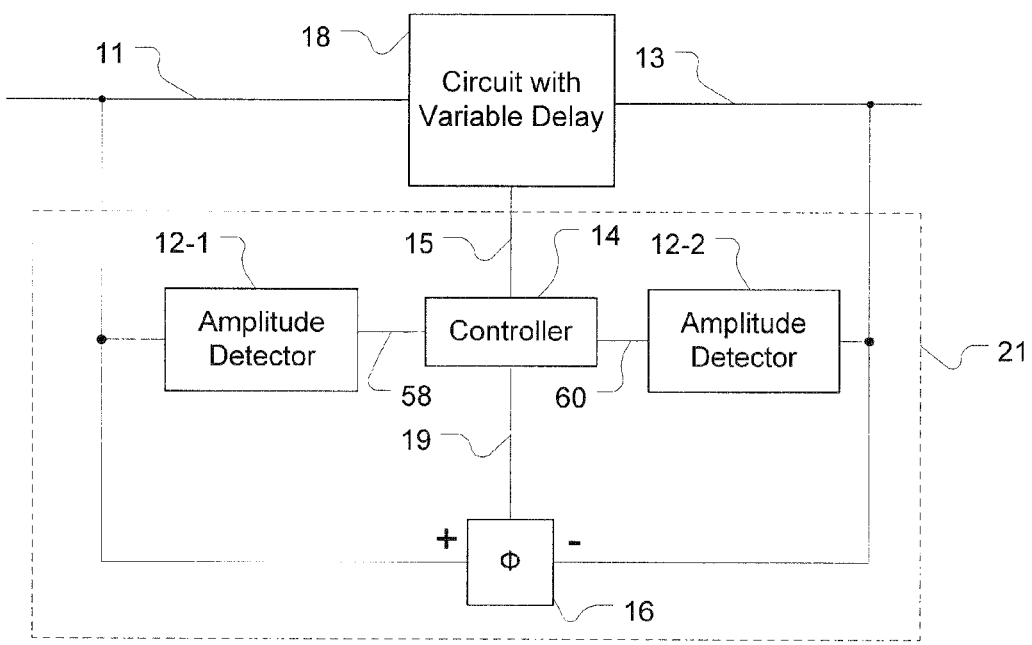
FIG. 5 is a block diagram of a system according to another embodiment.

FIG. 5 is a block diagram of a system according to another embodiment. In FIG. 5, a first amplitude detector 12-1 detects the amplitude of the input signal 11. A second amplitude detector 12-2 detects the amplitude of the output signal 13. Thus, as described above, the first amplitude detector 12-1 and the second amplitude detector 12-2 generate the input amplitude signal 58 and the output amplitude signal 60, respectively.

Using a multiplier as an example of the controller 14 in this embodiment, the phase error signal 19 is multiplied by both the input amplitude signal 58 and the output amplitude signal 60. Thus, if either the input amplitude signal 58 or the output amplitude signal 60 is relatively low, the contribution of a 180 degree phase error on the phase error signal 19 to the adjusted phase error signal 15 may be reduced.

Referring back to FIG. 3, the input amplitude signal 58 corresponds to the amplitude 20, and the output amplitude signal 60 corresponds to the amplitude 56. As illustrated in the relationship of chart 54 to chart 52, the low level of amplitude 20 corresponds to the beginning of the 180 degree phase error. Similarly, a low level of amplitude 56 corresponds to the end of the 180 degree phase error. Thus, by using a combination of the input amplitude signal 58 and the output amplitude signal 60, both leading edges and following edges of the large phase error may be reduced.

Even though the relationship of the phase error signal 19 and an amplitude such as the amplitude 20 or the delayed amplitude 56 have been illustrated as linked in time, such relationship may, but need not be maintained. For example, the lowest amplitude of the input amplitude signal 58 generally corresponds to the fastest phase change rate, in this case, the beginning of the 180 degree phase error. However, it may be desirable to align the lowest amplitude of the input amplitude signal 58 to the center of the 180 degree phase error. To accomplish this, the input amplitude signal 58 may be delayed such that the lowest amplitude corresponds to the largest magnitude of the phase error signal 19. Thus, the greatest reduction of the phase error signal 19 occurs when the magnitude of the phase error signal 19 is the greatest.

Although particular signals and the corresponding amplitudes have been described above as being used to adjust the phase error signal 19, signals other than and in addition to the input signal 11 and the output signal 13 may be used. Any signal having an amplitude that is correlated with a phase error may be used to adjust the phase error signal 16.

Figure 6:
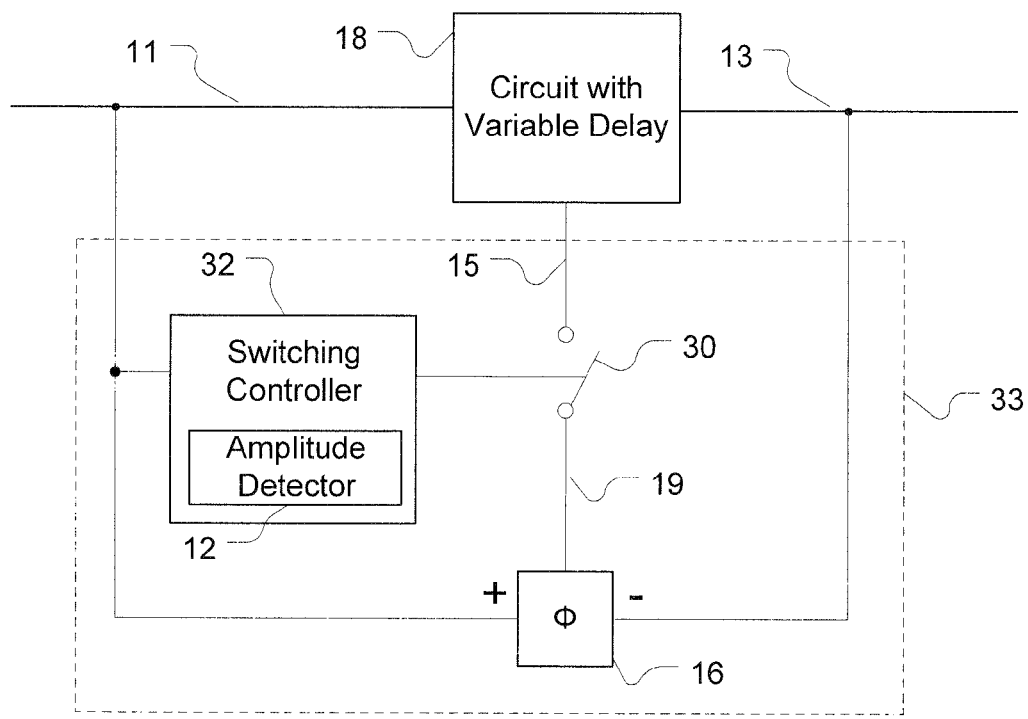
FIG. 6 is a block diagram of a system according to another embodiment.

FIG. 6 is a block diagram of a system according to another embodiment. The system includes a switching circuit 30 coupled between the phase comparator 16 and the circuit with variable delay 18, so that the delay of circuit with variable delay 18 can be responsive to controller output 15. A switching controller 32 controls the switching circuit 30 in response to the input signal 11. In this embodiment, the switching controller 32 includes an amplitude detector 12. Although the switching controller 32 and the switching circuit 30 have been described as distinct, the switching controller 32 and the switching circuit 30 may be combined together into a switching circuit.

In this embodiment the switching controller 32 compares the amplitude of the input signal 11 to a threshold. The threshold may be represented in a variety of ways. For example, the threshold may be a voltage or a current. The threshold may be generated from a value stored in a register or generated by a resistor network. Any technique appropriate for the comparison in the switching controller 32 may be used.

In response to the comparison, the switching controller 32 controls the switching circuit 30 to selectively pass the phase error signal 19. For example, if the amplitude of the input signal 11 is below the threshold, the switching circuit 30 may block the phase error signal 19. Since the 180 degree phase errors occur during smaller amplitudes, the 180 degree phase errors on the phase error signal 19 would be blocked from affecting the variable delay circuit 10. Thus, any phase induced distortion is diminished.

The switching circuit 30 may take many forms. For example, the switching circuit 30 may be a single transistor. When the amplitude is greater than the threshold, the switching controller 32 turns on the transistor to pass the phase error signal 19. Alternatively, when the amplitude is less than the threshold, the switching controller 32 turns off the transistor to block the phase error signal 19.

Alternatively, the switching circuit 30 may be a multiplier as described above. For example, the switching controller 32 may generate a two level signal from comparing the amplitude of input signal 11 to the threshold. Since two levels are generated from the switching controller 32, even if the multiplier is an analog multiplier, it will be controlled such that the phase error signal 19 is passed or blocked. Thus, any circuit that can be used to selectively pass and block the phase error signal 19 may be used as a switching circuit 30.

Furthermore, the relationship of a signal used by the controller 14 to adjust the phase error signal 19 may, but need not have a linear relationship to the effect on the phase error signal 19. For example, with multiplication using the amplitude described above, the amplitude has a linear relationship to the scaling of the phase error signal 19. In contrast, with the switching controller 32 and the multiplier described above, the relationship between the amplitude and the scaling of the phase error signal 19 has a discrete step, thus it is non-linear. Any relationship of the amplitude to the scaling of the phase error signal 19 may be used.

Figure 7:
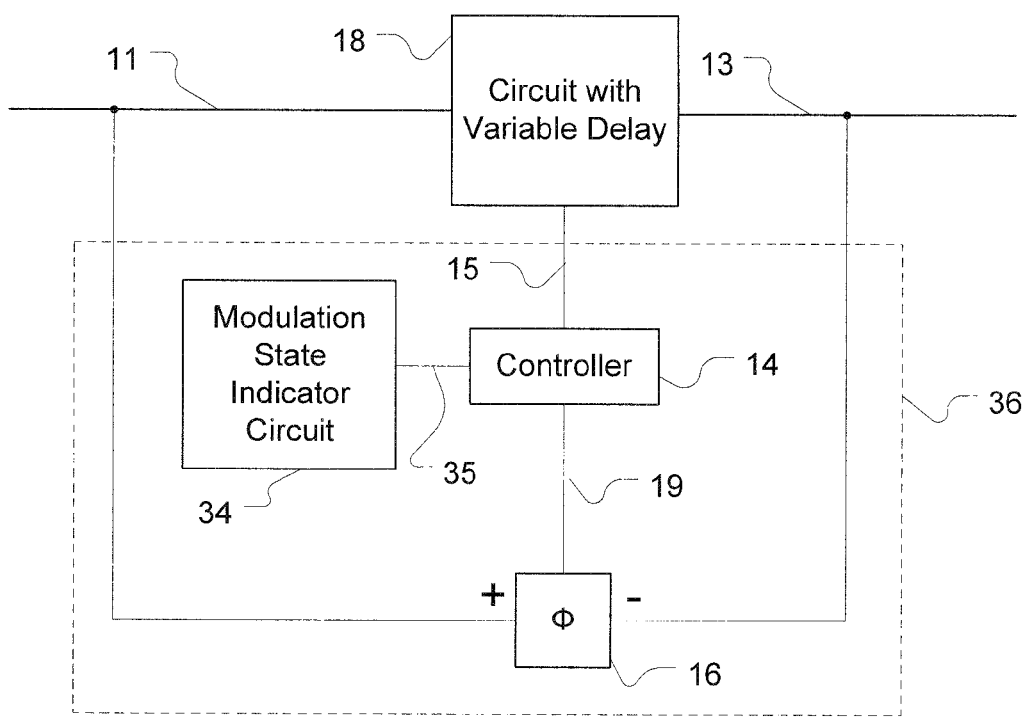
FIG. 7 is a block diagram of a system according to another embodiment.

FIG. 7 is a block diagram of a system according to another embodiment. The system includes a modulation state indicator circuit 34. The modulation state indicator circuit 34 generates a modulation state transition signal 35 indicating a state transition of modulation of the input signal 11. The controller 14 is responsive to the modulation state transition signal 35. Although the modulation state transition signal 35 indicates transitions in the state of the modulation of the input signal 11, it may, but need not be directly generated from the input signal 11. As described below, various other signals may exist that include information on the modulation of the input signal 11 and may be used to generate the modulation state transition signal 35.

For example, a digital signal processor may be generating the modulation for an in-phase component I and a quadrature-phase component Q used to generate a QPSK modulated signal. In QPSK, a 180 degree phase shift occurs when both the in-phase component I and the quadrature-phase component Q change phase during the same transition. Such a transition was illustrated in transition 29 of FIG. 2. Thus, during such a transition, the phase error signal 19, correspondingly indicates a 180 degree phase error.

Figure 8:
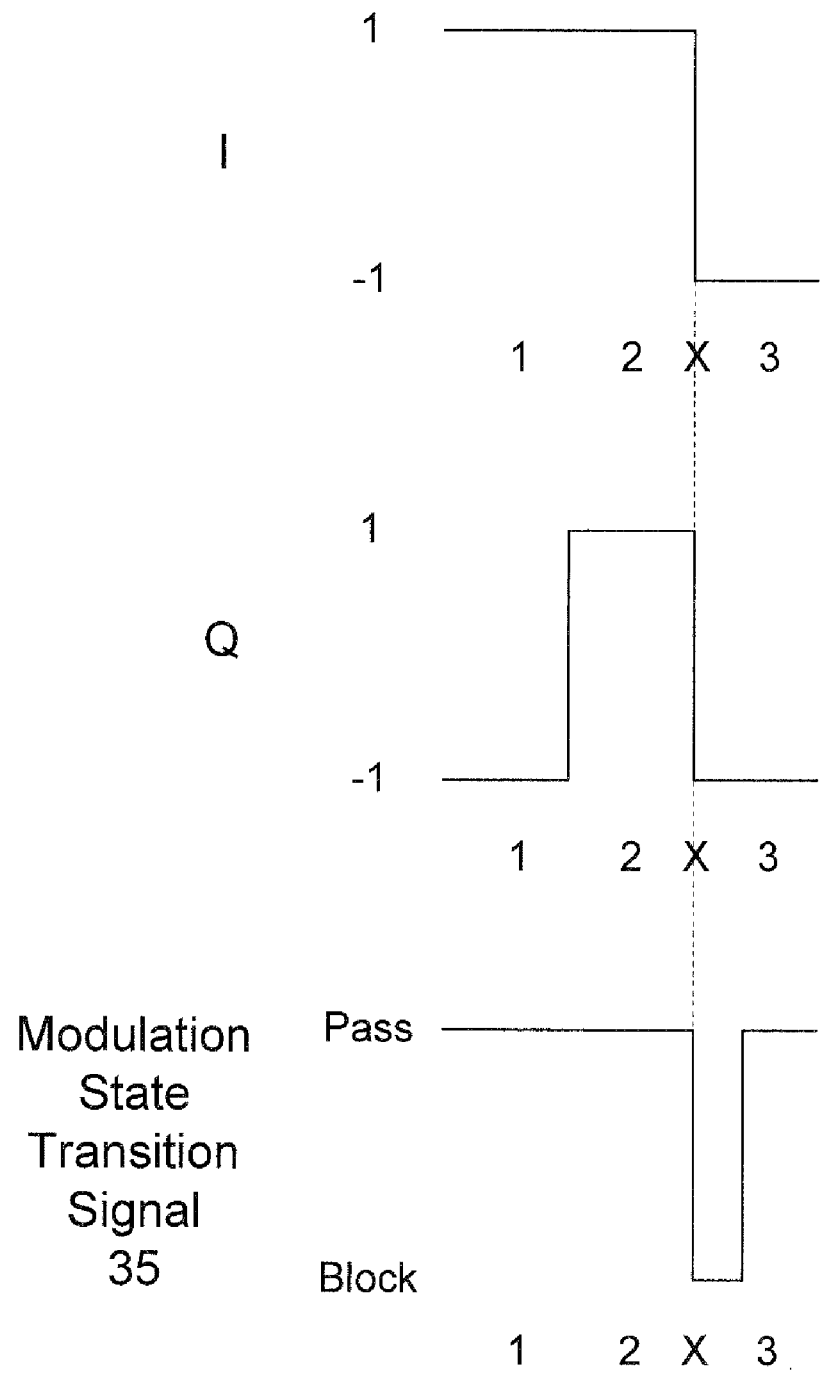
FIG. 8 is a timing diagram illustrating an example of a modulation state signal.

FIG. 8 is a timing diagram illustrating an example of a modulation state transition signal 35. The modulation state indicator circuit 34 generates a modulation state transition signal 35 from the modulation information of the in-phase component I and the quadrature-phase component Q. In this example, the points 1, 2, X, and 3 correspond to the same points illustrated in FIG. 2. At point X, both the in-phase component I and the quadrature-phase component Q are transitioning to the opposite state. During such a transition, the transition passes the origin of the constellation diagram, resulting in a 180 degree phase shift. Because the modulation state indicator circuit 34 has this information, the modulation state transition signal 35 may be generated. In this example the modulation state transition signal 35 begins at the phase transition and extends a period of time equivalent to the delay through the variable delay circuit 10.

Although a particular width, shape, timing, and other characteristics of the modulation state transition signal 35 has been described, the modulation state transition signal 35 may have any width, shape, timing, or other characteristics as needed to reduce distortions due to phase errors. For example, as described above, the modulation state transition signal 35 may be delayed such that it is centered on the 180 degree phase error when it appears in the phase error signal 19. In addition, the modulation state signal 35 may have a triangular or other shape with more than two levels.

In another example, the modulation format may be binary phase shift keying (BPSK). With BPSK, every transition results in a 180 degree phase shift. Thus, a modulation state transition signal 35 would be generated for every transition of the encoded information.

Although the use of signals in a variety of modulation formats has been described above, any modulation format from which phase transition information is available or may be obtained may be used to generate the modulation state transition signal 35. Furthermore, all information or component signals of a modulation format may, but need not be used. For example, only the in-phase component I may be used. When the amplitude of the in-phase component I decreases sufficiently, the phase error signal 19 may be adjusted. Even though this may result in more adjustment of the phase error signal 19 than as described above, large phase errors may still be reduced.

In another example, the modulation state indicator circuit 34 may generate a phase transition signal. The phase transition signal is a specific example of a modulation state transition signal 35. The phase transition signal indicates a phase transition on the input signal 11. Although phase transition signal indicates a phase transition on the input signal 11, the phase transition signal may, but need not be generated from the input signal 11. For example, the phase transition signal may be generated from a predecessor to the input signal 11. Similar to the modulation state signal 35 described above, the phase transition signal may have whatever width, shape, timing, or other characteristics as desired.

The modulation state indicator circuit 34 may have information on an amplitude of the modulation of the input signal 34. As described above, the amplitude of a modulated signal is related to a 180 degree phase shift. Thus, using the amplitude, the modulation circuit 34 may generate the phase transition signal.

In one example, a digital signal processor (DSP) may be controlling the modulation. The DSP may be generating the in-phase component I and the quadrature-phase component Q signals to generate the modulated signal. Since the DSP is generating such information, the DSP has information that can be used to generate the phase transition signal. The DSP is not limited to only this information, and may contain other information regarding the modulation. Thus, the DSP may generate the phase transition signal or any other modulation state transition signal 35.

Figure 9:
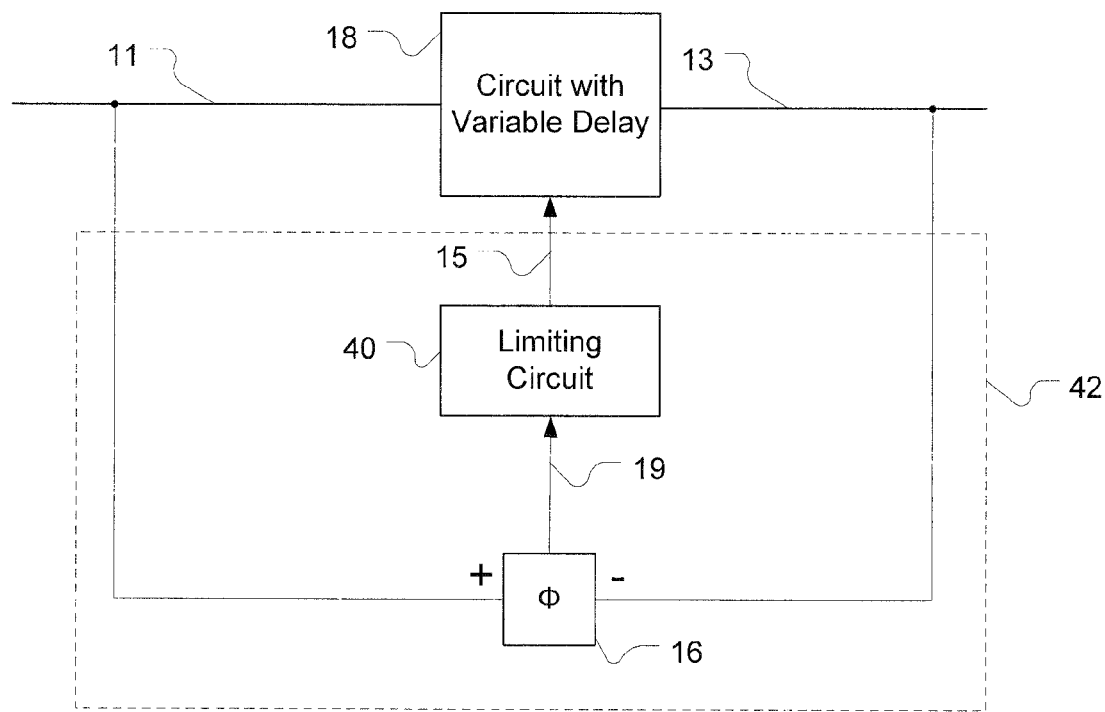
FIG. 9 is a block diagram of a system according to another embodiment.

FIG. 9 is a block diagram of a system according to another embodiment. The system includes an amplitude limiting circuit 40. The amplitude limiting circuit 40 is to limit an amplitude of the phase error signal 19 to generate an adjusted phase error signal 15. The amplitude limiting circuit is to limit the amplitude of the phase error signal if a magnitude of the phase error signal 19 exceeds a threshold.

As described above, when there is a 180 degree phase shift, the phase error signal 19 includes a corresponding 180 degree phase error. The amplitude limiting circuit 40 limits the amplitude of this signal to generate the adjusted phase error signal 15. As a result, even if there is a 180 degree phase shift on the input signal 11 or output signal 13, the effect of that 180 degree phase shift may be limited by the amplitude limiting circuit 40.

Any of a variety of circuits may be used for the amplitude limiting circuit 40. For example a pair of diodes may limit the amplitude of the phase error signal 19. Alternatively, an amplifier may include an output level control to limit the output swing. Any circuit that can limit, clip, or otherwise reduce the amplitude of a signal according to its amplitude may be used as an amplitude limiting circuit 40.

In general, any combination of the above described systems may be implemented in one or more circuits. Referring to FIG. 1, in one embodiment, a circuit 17 includes a phase comparator 16, an amplitude detector 12, and a controller 14. The phase comparator 16 has a first input and a second input. The phase comparator 16 is configured to generate a phase error signal on a phase error output indicating a difference in phase between a signal on the first input and a signal on the second input. In this embodiment, if the circuit 17 is coupled to the circuit with variable delay 18, the signal on the first input is the input signal 11 and the signal on the second input is the output signal 13.

The controller 14 is configured to generate an adjusted phase error signal 15 on an output in response to a characteristic of a signal on at least one of the inputs to the phase comparator 16. In the circuit 17 of FIG. 1, an output of an amplitude detector 12 adjusts the phase error signal 19 in the controller 14. Thus, the characteristic of one of the inputs to the phase comparator 16 is the amplitude of the input signal 11.

Similarly, in the circuit 19 of FIG. 4, the characteristic is the amplitude of the output signal 13. In the circuit 21 of FIG. 5, the characteristic is the amplitudes of both the input signal 11 and the output signal 13. In the circuit 33 of FIG. 6, the characteristic is whether the amplitude of the input signal 11 has crossed a threshold. In the circuit 36 of FIG. 7, the characteristic is the modulation information on a signal input to the phase comparator 16. In the circuit 42 of FIG. 9, the characteristic is a magnitude of a phase difference between the phases of the input signal 11 and the output signal 13 as embodied in the phase error signal 19.

Although particular examples of circuits and characteristics have been described in reference to the drawings, other circuits and characteristics may be used. Any characteristic as described above in reference to the systems and circuits, and any variations of such characteristics may be used to adjust the phase error signal 19 in the controller 14.

Figure 10:
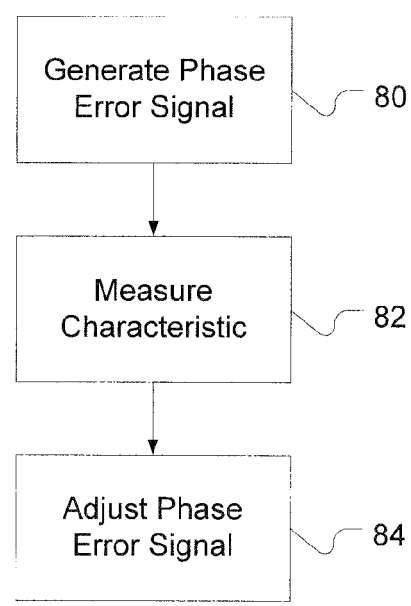
FIG. 10 is a flowchart showing how a phase error signal is adjusted according to an embodiment.

FIG. 10 is a flowchart showing how a phase error signal is adjusted according to an embodiment. In 80, the phase error signal indicating a phase difference between a first signal and a second signal is generated. In 82, a characteristic of the first signal is measured. In 84, the phase error signal is adjusted in response to the measured characteristic.

In one example, the first signal and the second signal may be the input signal 11 and the output signal 13 described above, respectively. Alternatively the input signal 11 and the output signal 13 may be swapped. As described above, the amplitude of one of the signals may be measured. Thus an amplitude of the first signal is measured. In response the phase error signal may be scaled in response to the measured amplitude.

In another example, a state of modulation of the first signal may be determined. Then the phase error signal is adjusted in response to the state of the modulation.

In another embodiment, the method may include limiting an amplitude of the phase error signal. Thus, by limiting the phase error signal, the phase error signal is adjusted.

In another embodiment, digital techniques can be used to process some of the signals of a system described herein. Whether a signal is represented in an analog form or a digital form will not change the functionality or principles of operation of the phase error de-glitching system according to various embodiments. For instance, variable delay circuit 10 from FIG. 1 could be implemented as part of the digital baseband modulation portion of a system. Likewise, all or part of the circuits comprising amplitude detector 12, controller 14, filter 8, or phase comparator 16, could be implemented in digital form.

Although particular embodiments have been described, various combinations and modifications may be made and still be within the spirit and scope of the following claims.

The invention claimed is:

1. A system, comprising:
    a phase comparator configured to compare phases of a first signal and a second signal to generate a phase error signal indicative of a phase difference between the phases of the first signal and the second signal;
    an amplitude limiting circuit configured to limit an amplitude of the phase error signal if a magnitude of the phase error signal exceeds a threshold to generate an adjusted phase error signal; and
    a circuit including a variable delay between an input and an output, where the input is configured to receive the first signal, the circuit is configured to generate the second signal on the output, and the variable delay is responsive to the adjusted phase error signal.

2. The system of claim 1, wherein the variable delay corrects phase distortion between the first signal and the second signal responsive to the adjusted phase error signal.

3. A method, comprising:
    comparing phases of a first signal and a second signal to generate a phase error signal indicative of a phase difference between the phases of the first signal and the second signal; and
    limiting an amplitude of the phase error signal if a magnitude of the phase error signal exceeds a threshold to generate an adjusted phase error signal, and
    wherein a circuit receives the first signal on an input and generates the second signal on an output, and the circuit includes a variable delay that is responsive to the adjusted phase error signal.

4. The method of claim 3, wherein the variable delay corrects phase distortion between the first signal and the second signal responsive to the adjusted phase error signal.

* * * * *